United States Patent
Khlat et al.

(10) Patent No.: US 10,284,412 B2
(45) Date of Patent: May 7, 2019

(54) VOLTAGE MEMORY DIGITAL PRE-DISTORTION CIRCUIT

(71) Applicant: Qorvo US, Inc., Greensboro, NC (US)

(72) Inventors: Nadim Khlat, Cugnaux (FR); Jean-Frederic Chiron, Tournefeuille (FR); Andrew F. Folkmann, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/792,909

(22) Filed: Oct. 25, 2017

(65) Prior Publication Data

US 2019/0020526 A1 Jan. 17, 2019

Related U.S. Application Data

(60) Provisional application No. 62/533,193, filed on Jul. 17, 2017.

(51) Int. Cl.
| | |
|---|---|
| *H04K 1/02* | (2006.01) |
| *H04L 27/36* | (2006.01) |
| *H03F 3/24* | (2006.01) |
| *H03F 3/217* | (2006.01) |
| *H03G 3/30* | (2006.01) |
| *H03F 3/19* | (2006.01) |

(52) U.S. Cl.
CPC ............ *H04L 27/361* (2013.01); *H03F 3/19* (2013.01); *H03F 3/217* (2013.01); *H03F 3/245* (2013.01); *H03G 3/3042* (2013.01); *H04L 27/368* (2013.01)

(58) Field of Classification Search
CPC ....... H04L 27/361; H04L 27/368; H03F 3/19; H03F 3/217; H03F 3/245; H03G 3/3042

USPC .......................................................... 375/297
See application file for complete search history.

(56) References Cited

U.S. PATENT DOCUMENTS

| | | | | |
|---|---|---|---|---|
| 6,141,377 | A * | 10/2000 | Sharper | H04M 11/062 375/222 |
| 6,985,033 | B1 * | 1/2006 | Shirali | H03F 1/3247 330/149 |
| 7,043,213 | B2 | 5/2006 | Robinson et al. | |

(Continued)

OTHER PUBLICATIONS

Non-Final Office Action for U.S. Appl. No. 15/888,300, dated Aug. 28, 2018, 11 pages.

(Continued)

*Primary Examiner* — Helene E Tayong
(74) *Attorney, Agent, or Firm* — Withrow & Terranova, P.L.L.C.

(57) ABSTRACT

An envelope tracking (ET) amplifier circuit is provided. The voltage mDPD circuit is provided in an ET amplifier circuit and configured to determine a voltage deviation relative to an ET modulated target voltage signal, execute an mDPD polynomial in one or more iterations to extract an mDPD coefficient(s), and adjust a time-variant target voltage envelope of the ET modulated target voltage signal based on the mDPD coefficient(s) extracted in each of the mDPD iterations to reduce the voltage deviation to a predefined threshold. By reducing the voltage deviation in the ET modulated voltage, it is possible improve linearity (e.g., gain linearity) of the ET amplifier circuit, which can lead to reduced power consumption and improved radio frequency (RF) performance.

21 Claims, 9 Drawing Sheets

(56) References Cited

U.S. PATENT DOCUMENTS

| | | | |
|---|---|---|---|
| 7,471,155 B1* | 12/2008 | Levesque | H03F 1/30 330/296 |
| 7,570,931 B2 | 8/2009 | McCallister et al. | |
| 8,718,188 B2 | 5/2014 | Balteanu et al. | |
| 8,879,665 B2 | 11/2014 | Xia et al. | |
| 8,913,690 B2 | 12/2014 | Onishi | |
| 9,041,365 B2 | 5/2015 | Kay et al. | |
| 9,065,509 B1 | 6/2015 | Yan et al. | |
| 9,098,099 B2* | 8/2015 | Park | H03F 1/0227 |
| 9,166,830 B2 | 10/2015 | Camuffo et al. | |
| 9,263,997 B2 | 2/2016 | Vinayak | |
| 9,280,163 B2 | 3/2016 | Kay et al. | |
| 9,288,098 B2* | 3/2016 | Yan | H04B 1/0475 |
| 9,344,304 B1 | 5/2016 | Cohen | |
| 9,520,907 B2* | 12/2016 | Peng | H04B 1/0475 |
| 9,595,981 B2 | 3/2017 | Khlat | |
| 9,748,845 B1 | 8/2017 | Kotikalapoodi | |
| 9,806,676 B2 | 10/2017 | Balteanu et al. | |
| 9,923,520 B1 | 3/2018 | Abdelfattah et al. | |
| 2009/0045872 A1 | 2/2009 | Kenington | |
| 2011/0136452 A1 | 6/2011 | Pratt et al. | |
| 2012/0194274 A1 | 8/2012 | Fowers et al. | |
| 2012/0200435 A1 | 8/2012 | Ngo et al. | |
| 2013/0187711 A1 | 7/2013 | Goedken et al. | |
| 2014/0009226 A1 | 1/2014 | Severson et al. | |
| 2014/0155002 A1* | 6/2014 | Dakshinamurthy | H04B 1/0475 455/90.2 |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1* | 9/2014 | Chiron | H03F 1/02 330/127 |
| 2014/0315504 A1 | 10/2014 | Sakai et al. | |
| 2014/0361830 A1 | 12/2014 | Mathe et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1* | 10/2015 | Cohen | H03F 1/0222 330/297 |
| 2015/0333781 A1 | 11/2015 | Alon et al. | |
| 2016/0065137 A1 | 3/2016 | Khlat | |
| 2016/0105151 A1 | 4/2016 | Langer | |
| 2016/0118941 A1* | 4/2016 | Wang | H03F 1/0222 330/291 |
| 2016/0187627 A1 | 6/2016 | Abe | |
| 2016/0197627 A1* | 7/2016 | Qin | H03F 1/0227 375/297 |
| 2017/0317913 A1* | 11/2017 | Kim | H04L 43/0829 |
| 2017/0338773 A1 | 11/2017 | Balteanu et al. | |
| 2018/0048276 A1 | 2/2018 | Khlat et al. | |
| 2018/0076772 A1 | 3/2018 | Khesbak et al. | |

OTHER PUBLICATIONS

Notice of Allowance for U.S. Appl. No. 15/728,202, dated Aug. 2, 2018, 7 pages.

Non-Final Office Action for U.S. Appl. No. 14/836,634, dated May 16, 2016, 9 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

* cited by examiner

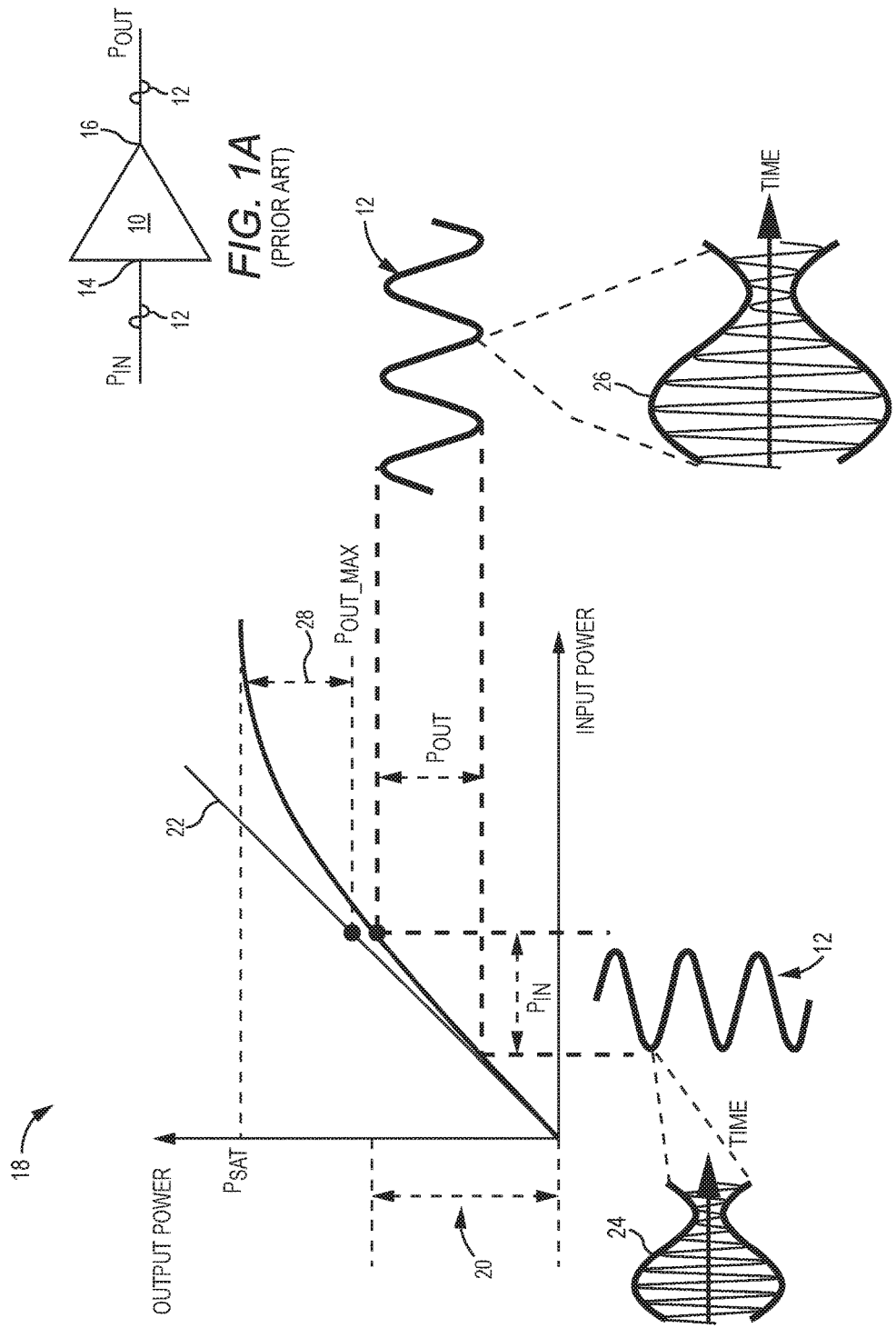

VOLTAGE MEMORY DIGITAL PRE-DISTORTION CIRCUIT

RELATED APPLICATIONS

This application claims the benefit of U.S. Provisional Patent Application Ser. No. 62/533,193, filed on Jul. 17, 2017, which is incorporated herein by reference in its entirety.

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by advanced wireless communication technologies, such as long-term evolution (LTE) and fifth-generation new radio (5G-NR). To achieve the higher data rates in mobile communication devices, power amplifiers (PAs) may be employed to increase output power of radio frequency (RF) signals (e.g., maintaining sufficient energy per bit) communicated by mobile communication devices.

PAs are inherently nonlinear. The nonlinearity generates spectral re-growth that can lead to adjacent channel interference and/or in-band distortion. As a result, the RF signals outputted by the PAs may violate regulatory out-of-band emission requirements and/or suffer an increased bit-error-rate (BER). To help reduce nonlinearity, the PAs may be configured with a relatively large back-off so as to operate within a linear portion of a PA's operating curve. However, the RF signals transmitted in LTE and 5G-NR systems typically have higher peak-to-average ratios (PARs). In this regard, the back-off needs to be well below maximum saturated output power of the PA to handle sporadic high peaks of the RF signals. As a result, the PAs may be forced to operate with very low efficiency (e.g., less than 10%), with a large portion of the PA power (e.g., 90%) being turned into thermal heat.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system needs to constantly adjust supply voltage applied to the PAs to ensure that the PAs are operating at a higher efficiency.

SUMMARY

Aspects disclosed in the detailed description include a voltage memory digital pre-distortion (mDPD) circuit. In examples discussed herein, the voltage mDPD circuit is provided in an envelope tracking (ET) amplifier circuit to help reduce a voltage deviation in an ET modulated voltage that is used by an amplifier circuit(s) for amplifying a radio frequency (RF) signal. The voltage mDPD circuit is configured to determine the voltage deviation relative to an ET modulated target voltage signal and execute an mDPD polynomial in one or more iterations to extract an mDPD coefficient(s). Accordingly, the voltage mDPD circuit adjusts a time-variant target voltage envelope of the ET modulated target voltage signal based on the mDPD coefficient(s) extracted in each of the mDPD iterations to reduce the voltage deviation to a predefined threshold. By reducing the voltage deviation in the ET modulated voltage, it is possible to improve linearity (e.g., gain linearity) of the ET amplifier circuit, which can lead to reduced power consumption and improved RF performance.

In one aspect, an ET amplifier circuit is provided. The ET amplifier circuit includes at least one amplifier circuit configured to amplify an RF signal based on an ET modulated voltage. The ET amplifier circuit also includes ET tracker circuitry configured to receive an ET modulated target voltage signal comprising a time-variant target voltage envelope and generate the ET modulated voltage comprising a time-variant voltage envelope tracking the time-variant target voltage envelope. The ET amplifier circuit also includes a voltage input path configured to provide the ET modulated target voltage signal to the ET tracker circuitry. The voltage input path comprises a voltage mDPD circuit. The voltage mDPD circuit is configured to determine a voltage deviation of the ET modulated voltage relative to the ET modulated target voltage signal. The voltage mDPD circuit is also configured to execute an mDPD polynomial in one or more iterations. Each of the one or more iterations is selectively configured to extract at least one mDPD coefficient. The voltage mDPD circuit is also configured to adjust the time-variant target voltage envelope based on the at least one mDPD coefficient extracted in each of the one or more iterations to reduce the voltage deviation to a predefined threshold.

In another aspect, a method for performing voltage mDPD in an ET amplifier circuit is provided. The method includes determining a voltage deviation of an ET modulated voltage relative to an ET modulated target voltage signal. The ET modulated target voltage signal includes a time-variant target voltage envelope and the ET modulated voltage includes a time-variant voltage envelope tracking the time-variant target voltage envelope. The method also includes executing an mDPD polynomial in one or more iterations. Each of the one or more iterations is selectively configured to extract at least one mDPD coefficient. The method also includes adjusting the time-variant target voltage envelope based on the at least one mDPD coefficient extracted in each of the one or more iterations to reduce the voltage deviation to a predefined threshold.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 1A is a schematic diagram of an exemplary power amplifier (PA);

FIG. 1B is a PA operation curve providing an exemplary illustration of linear behavior of the PA of FIG. 1A in a linearity region;

DETAILED DESCRIPTION

Figure 1C:
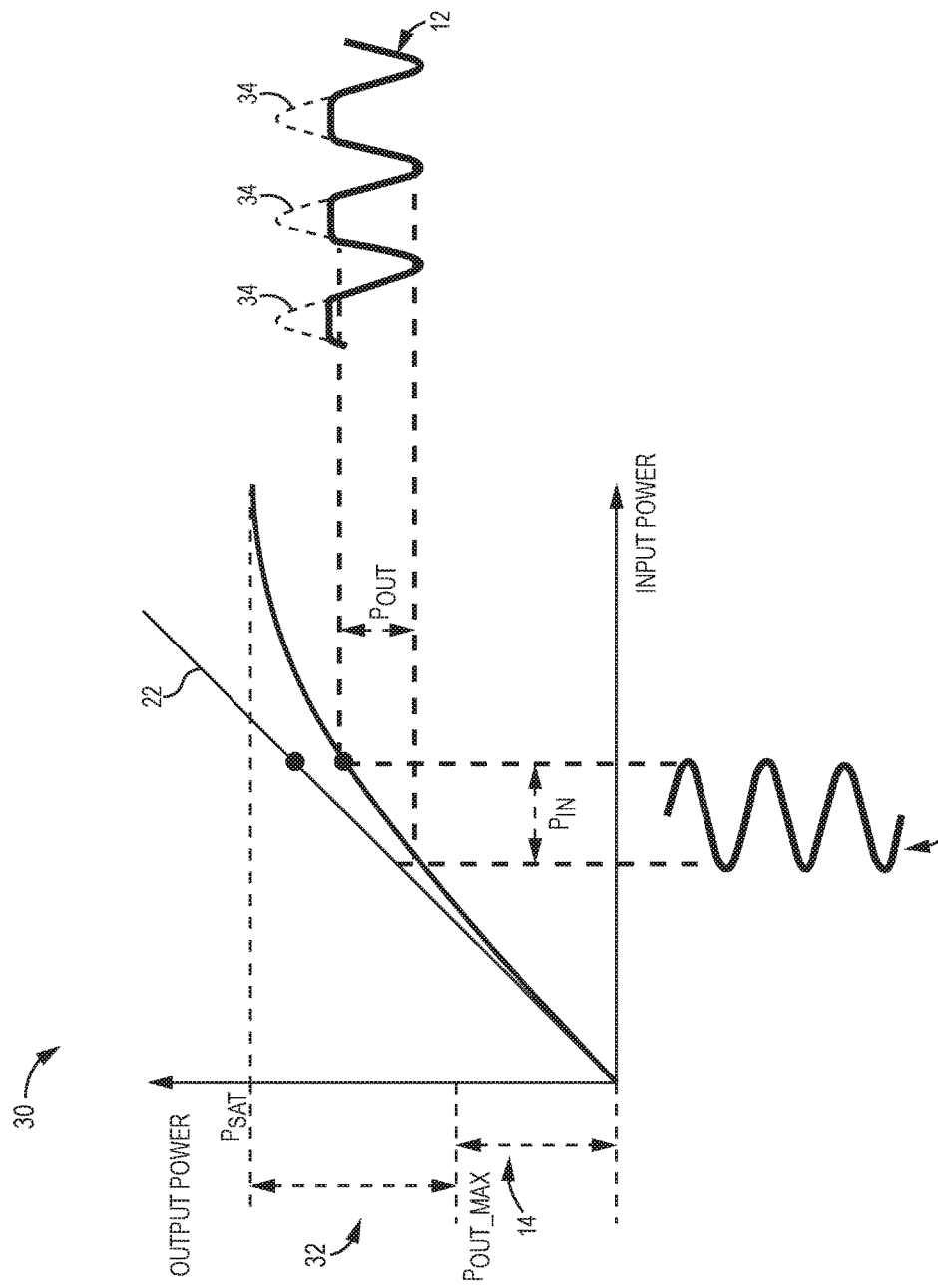
FIG. 1C is a PA operation curve providing an exemplary illustration of nonlinear behavior of the PA of FIG. 1A in a nonlinearity region.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a voltage memory digital pre-distortion (mDPD) circuit. In examples discussed herein, the voltage mDPD circuit is provided in an envelope tracking (ET) amplifier circuit to help reduce a voltage deviation in an ET modulated voltage that is used by an amplifier circuit(s) for amplifying a radio frequency (RF) signal. The voltage mDPD circuit is configured to determine the voltage deviation relative to an ET modulated target voltage signal and execute an mDPD polynomial in one or more iterations to extract an mDPD coefficient(s). Accordingly, the voltage mDPD circuit adjusts a time-variant target voltage envelope of the ET modulated target voltage signal based on the mDPD coefficient(s) extracted in each of the mDPD iterations to reduce the voltage deviation to a predefined threshold. By reducing the voltage deviation in the ET modulated voltage, it is possible to improve linearity (e.g., gain linearity) of the ET amplifier circuit, which can lead to reduced power consumption and improved RF performance.

Before discussing the voltage mDPD circuit of the present disclosure, a brief overview of power amplifier memory effect and the mDPD principle for overcoming the power amplifier memory effect is first provided with reference to FIGS. 1A-1E. A brief discussion of an ET amplifier circuit in which a voltage mDPD circuit can be provided to help improve ET voltage linearity is then provided with reference to FIGS. 2A and 2B. The discussion of specific exemplary aspects of using a voltage mDPD circuit to help improve ET voltage linearity in an ET amplifier circuit starts below with reference to FIG. 3.

FIG. 1A is a schematic diagram of an exemplary power amplifier (PA) 10. The PA 10 is configured to receive an RF signal 12 at an input end 14 and output the RF signal 12 at an output end 16. The RF signal 12 received at the input end 14 has an input power $P_{IN}$ and the RF signal 12 outputted at the output end 16 has an output power $P_{OUT}$.

FIG. 1B is a PA operation curve 18 providing an exemplary illustration of linear behavior of the PA 10 of FIG. 1A in a linearity region 20. Common elements between FIGS. 1A and 1B are shown therein with common element numbers and will not be re-described herein.

When the PA 10 operates in the linearity region 20, the output power $P_{OUT}$ is linearly related to the input power $P_{IN}$ according to a linear gain curve 22. In this regard, the output power $P_{OUT}$ is determined by a gain (G) of the PA 10 ($P_{OUT}=G\times P_{IN}$). Notably, the RF signal 12 is inherently associated with time-variant amplitudes, which is commonly defined by a peak-to-average ratio (PAR).

As a result, the RF signal 12 at the input end 14 is confined to a time-variant input amplitude envelope 24. Accordingly, the RF signal 12 at the output end 16 is confined to a time-variant output amplitude envelope 26 that tracks the time-variant input amplitude envelope 24.

For the PA 10 to operate in the linearity region 20, the PA 10 can be configured to operate with a power back-off 28, which represents a differential between a maximum output power $P_{OUT\_MAX}$ and a saturation power $P_{SAT}$ of the PA 10. In this regard, as long as the output power $P_{OUT}$ is below the maximum output power $P_{OUT\_MAX}$, the output power $P_{OUT}$ is linearly proportional to the input power $P_{IN}$ and the time-variant output amplitude envelope 26 tracks linearly (e.g., linearly proportional to) the time-variant input amplitude envelope 24 over time.

However, when the PA 10 is provided in such advanced wireless communication devices and/or systems as long-term evolution (LTE) and fifth-generation new radio (5G-NR), the output power $P_{OUT}$ of the RF signal 12 can increase significantly (e.g., ≥23 dBm). As a result, the RF signal 12 can be associated with an increased PAR. Accordingly, the time-variant input amplitude envelope 24 and the time-variant output amplitude envelope 26 can exhibit increased fluctuations over time. Unfortunately, the increased envelope fluctuation can cause the PA 10 to operate outside the linearity region 20.

FIG. 1C is a PA operation curve 30 providing an exemplary illustration of nonlinear behavior of the PA 10 of FIG. 1A in a nonlinearity region 32. Common elements between FIGS. 1A, 1B, and 1C are shown therein with common element numbers and will not be re-described herein.

Notably, with increased peaks in the time-variant input amplitude envelope 24 and the time-variant output amplitude envelope 26, the output power $P_{OUT}$ of the RF signal 12 needs to increase accordingly. Consequently, the output power $P_{OUT}$ may exceed the maximum output power $P_{OUT-MAX}$, thus causing the PA 10 to operate outside the linearity region 20 in the nonlinearity region 32.

When the PA 10 operates in the nonlinearity region 32, the output power $P_{OUT}$ is no longer linearly related to the input power $P_{IN}$ in accordance with the linear gain curve 22. Instead, the output power $P_{OUT}$ may be compressed. In this regard, as the input power $P_{IN}$ increases, the output power $P_{OUT}$ would increase disproportionally (e.g., less than) to the increase of the input power $P_{IN}$. As a result, the RF signal 12 outputted by the PA 10 at the output end 16 may have one or more compressed peaks 34, thus causing the time-variant output amplitude envelope 26 to deviate from the time-variant input amplitude envelope 24.

Figure 1D:
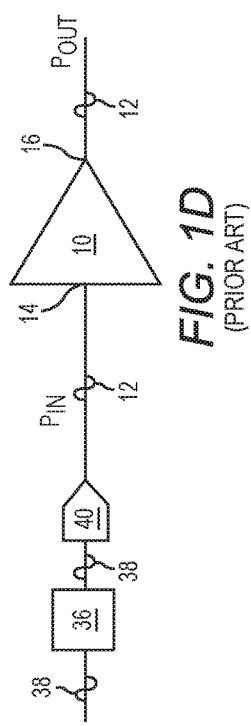
FIG. 1D is a schematic diagram of an exemplary digital signal processor configured to perform digital pre-distortion (DPD) to improve linearity of the PA of FIG. 1A.

Digital pre-distortion (DPD) is a cost-effective linearization technique commonly employed to help improve linearity of the PA 10. DPD takes advantages in digital signal processing and digital-to-analog (D/A) conversion. In this regard, FIG. 1D is a schematic diagram of an exemplary digital signal processor 36 configured to perform DPD to improve linearity of the PA 10 of FIG. 1A. Common elements between FIGS. 1A and 1D are shown therein with common element numbers and will not be re-described herein.

The digital signal processor 36 is coupled to the PA 10 and configured to expand an amplitude peak(s) in a digital baseband signal 38. A digital-to-analog converter (DAC) 40 converts the digital baseband signal into the RF signal 12 with the expanded amplitude peak(s) and provides the RF signal 12, with the expanded amplitude peaks, to the PA 10. By expending the amplitude peak(s) of the RF signal 12, it is possible to improve the linearity of the PA 10.

Figure 1E:
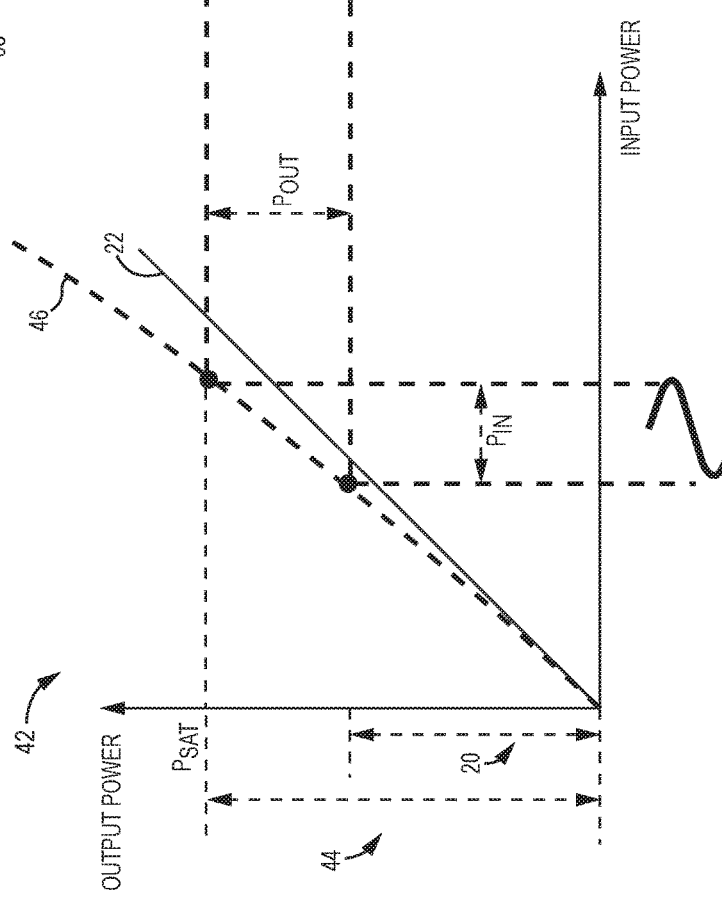
FIG. 1E is a PA operation curve providing an exemplary illustration of linear behavior of the PA of FIG. 1A in an expended linearity region as a result of the DPD performed by the digital signal processor of FIG. 1D.

FIG. 1E is a PA operation curve 42 providing an exemplary illustration of linear behavior of the PA 10 of FIG. 1A in an expended linearity region 44 as a result of DPD performed by the digital signal processor 36 of FIG. 1D. Common elements between FIGS. 1A, 1B, 1C, 1D, and 1E are shown therein with common element numbers and will not be re-described herein.

As a result of performing the DPD by the digital signal processor 36, the PA 10 can be configured to operate according to an expanded linear gain curve 46 in the expended linearity region 44. Accordingly, the time-variant output amplitude envelope 26 linearly tracks the time-variant input amplitude envelope 24.

DPD can be implemented based on a memory-less DPD model or a memory DPD model. The memory-less DPD model, which may be implemented based on a look-up table (LUT), is typically employed to correct memory-less nonlinearity of nonlinear circuitry, that is, a current output of the nonlinear circuitry depends only on current input of the nonlinear circuitry. In contrast, the memory DPD (mDPD) model is commonly employed to correct memory nonlinearity of nonlinear circuitry, that is, a current output of the nonlinear circuitry depends not only on current input of the nonlinear circuitry, but also on past inputs of the nonlinear circuitry. Such phenomenon is known as memory effect. The cause of the memory effect may be attributed to thermal constants of active components that are frequency dependent.

Given that the PA 10 employs such frequency dependent active components, the PA 10 exhibits the memory effect, especially when the RF signal 12 includes a large number of resource blocks (RBs) transmitted in a higher carrier frequency (e.g., millimeter wave spectrum). As such, the mDPD model is often employed to help improve linearity in the PA 10.

The mDPD model is typically implemented based on an mDPD polynomial as defined in equation (Eq. 1) below.

$$y_k = h_0 + \sum_{n=1}^{N} \sum_{d=0}^{D} h_{n,d} \cdot |x_{k-d}|^{n-1} \cdot x_{k-d} \qquad \text{(Eq. 1)}$$

In the equation (Eq. 1) above, x and y represent input and output of the mDPD model, respectively. N, D, and $h_{n,d}$ represent nonlinearity order, memory order, and coefficient, respectively. The mDPD polynomial in the equation (Eq. 1) can be further represented by a generalized memory polynomial (GMP) as in equation (Eq. 2) below.

$$\begin{aligned}y_k = &h_0 + \sum_{n=1}^{Na} \sum_{d=0}^{Da1} a_{n,d1} \cdot |x_{k-d1}|^{n-1} \cdot x_{k-d1} + \\ &\sum_{n=1}^{Nb} \sum_{d1=0}^{Db1} \sum_{d2=0}^{Db2} b_{n,d1,d2} \cdot |x_{k-d1-d2}|^{n-1} \cdot x_{k-d1} + \sum_{n=1}^{Nc} \sum_{d1=0}^{Dc1} \sum_{d2=0}^{Dc2} c_{n,d1,d2} \cdot \\ &|x_{k-d1+d2}|^{n-1} \cdot x_{k-d1}\end{aligned} \qquad \text{(Eq. 2)}$$

The term $\sum_{n=1}^{Nb}\sum_{d1=0}^{Db1}\sum_{d2=0}^{Db2} b_{n,d1,d2}^* j|x_{k-d1-d2}|^{n-1}*x_{k-d1}$ and the term $\sum_{n=1}^{Nc}\sum_{d1=0}^{Dc1}\sum_{d2=0}^{Db2} c_{n,d1,d2}^*|x_{k-d1+d2}|^{n-1}*x_{k-d1}$ in the equation (Eq. 2) above represent an extra envelope lag term and an extra envelope lead term, respectively. In the examples discussed herein, the GMP as expressed in the equation (Eq. 2) is employed in an ET amplifier circuit to help reduce nonlinearity of an amplifier circuit(s).

Figure 2A:
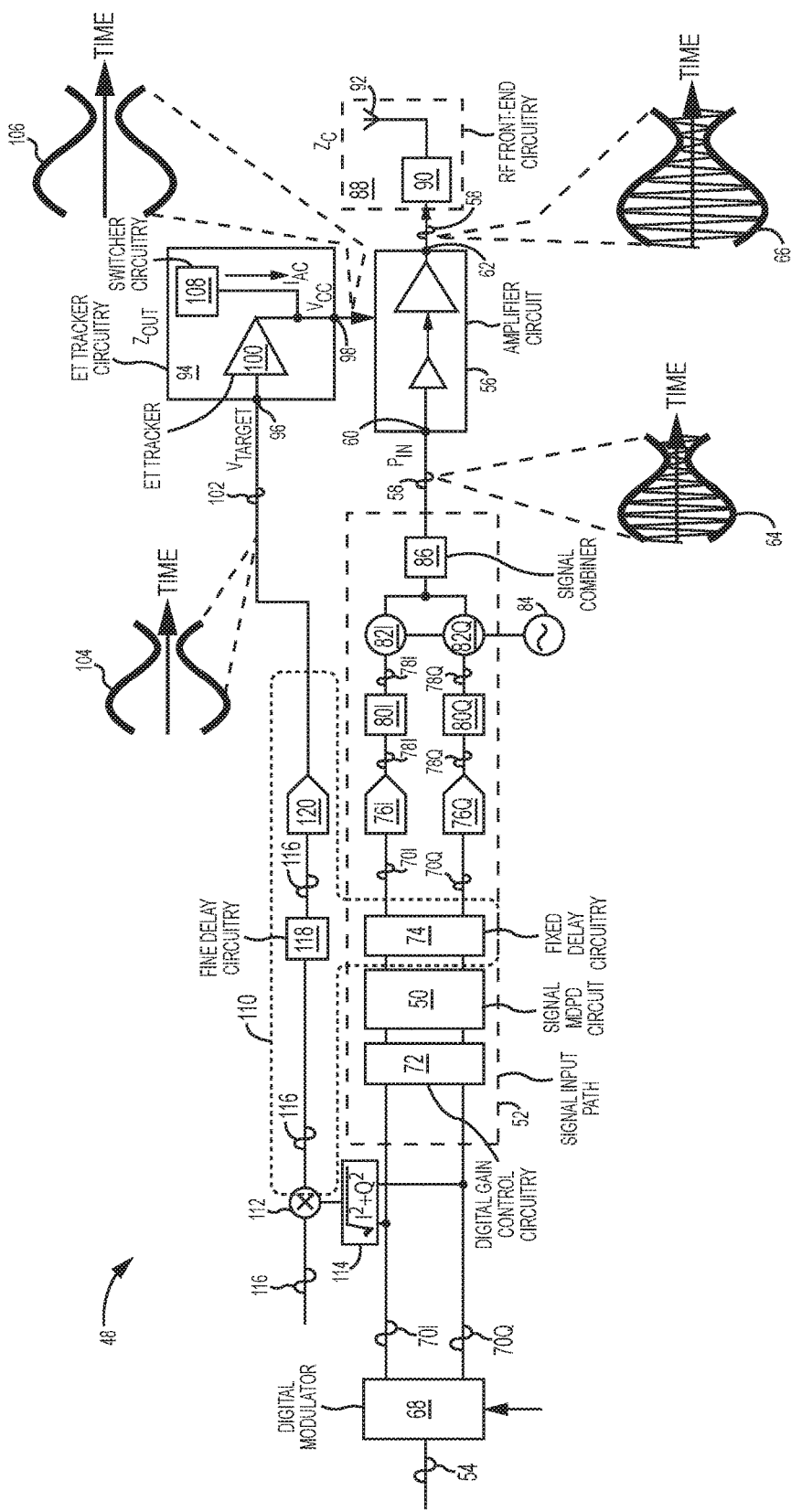
FIG. 2A is a schematic diagram of an exemplary envelope tracking (ET) amplifier circuit including a signal memory digital pre-distortion (mDPD) circuit provided in a signal input path and configured to perform mDPD on a digital baseband signal to help reduce memory nonlinearity of at least one amplifier circuit.

FIG. 2A is a schematic diagram of an exemplary ET amplifier circuit 48 including a signal mDPD circuit 50 provided in a signal input path 52 and configured to perform mDPD on a digital baseband signal 54 to help reduce memory nonlinearity of at least one amplifier circuit 56. The amplifier circuit 56 receives an RF signal 58 in a carrier frequency at a signal input 60 and outputs the RF signal 58 in the carrier frequency at a signal output 62. The RF signal 58 has an input power $P_{IN}$ at the signal input 60 and an output power $P_{OUT}$ at the signal output 62. Similar to the RF signal 12 in FIGS. 1A-1E, the RF signal 58 at the signal input 60 is confined to a time-variant input amplitude envelope 64. Accordingly, the RF signal 58 at the signal output 62 is confined to a time-variant output amplitude envelope 66 that tracks the time-variant input amplitude envelope 64.

If the amplifier circuit 56 is linear, the output power $P_{OUT}$ would be proportionally related to the input power $P_{IN}$ by an amplifier gain G ($P_{OUT}=G\times P_{IN}$). However, as described earlier, the amplifier circuit 56 may lose linearity when the RF signal 58 is in a higher carrier frequency and the output power $P_{OUT}$ increases beyond a certain threshold. Moreover, as discussed above, nonlinearity behavior of the amplifier circuit 56 can exhibit so-called memory effect. As such, it is necessary to perform mDPD in the signal input path 52 to help improve linearity of the amplifier circuit 56.

The ET amplifier circuit 48 includes a digital modulator 68 configured to modulate the digital baseband signal 54 to generate a digital in-phase (I) signal 70I and a digital quadrature (Q) signal 70Q. The signal input path 52 is coupled to the signal input 60 of the amplifier circuit 56 and configured to receive the digital I signal 70I and the digital Q signal 70Q. The signal input path 52 may include digital gain control circuitry 72 configured to adjust signal strength of the digital I signal 70I and/or the digital Q signal 70Q. The signal mDPD circuit 50 may be configured to process the digital I signal 70I and the digital Q signal 70Q based on the GMP as defined in the equation (Eq. 2).

The signal input path 52 may include fixed delay circuitry 74 configured to add a fixed delay to the digital I signal 70I and the digital Q signal 70Q. The signal input path 52 includes an I signal DAC 76I configured to convert the digital I signal 70I into an analog I signal 78I. The signal input path 52 also includes a Q signal DAC 76Q configured to convert the digital Q signal 70Q into an analog Q signal 78Q. The signal input path 52 may include an I signal filter 80I and a Q signal filter 80Q configured to eliminate unwanted frequency elements from the analog I signal 78I and the analog Q signal 78Q, respectively. The signal input path 52 may include an I signal mixer 82I and a Q signal mixer 82Q coupled to a local oscillator (LO) 84. The I signal mixer 82I and the Q signal mixer 82Q may be configured to upshift the analog I signal 78I and the analog Q signal 78Q from an intermediate frequency (IF) to the carrier frequency based on an oscillation frequency generated by the LO 84. The signal input path 52 includes a signal combiner 86 configured to combine the analog I signal 78I and the analog Q signal 78Q to generate the RF signal 58. The signal combiner 86 provides the RF signal 58 to the signal input 60 of the amplifier circuit 56.

The signal output 62 of the amplifier circuit 56 may be coupled to RF front-end circuitry 88 that includes transmit filter circuitry 90 and an antenna(s) 92. When looking from the signal output 62 into the RF front-end circuitry 88, the RF front-end circuitry 88 presents frequency-dependent impedance $Z_c$ that may changes based on the carrier frequency of the RF signal 58.

The ET amplifier circuit 48 includes ET tracker circuitry 94 having an input node 96 and an output node 98. The ET tracker circuitry 94 includes at least one ET tracker 100 coupled between the input node 96 and the output node 98. The ET tracker 100 is configured to receive an ET modulated target voltage signal 102, which represents an ET modulated target voltage $V_{TARGET}$, at the input node 96 and generate an ET modulated voltage $V_{CC}$ at the output node 98. The ET modulated target voltage signal 102 is defined by a time-variant target voltage envelope 104 that tracks the time-variant input amplitude envelope 64 of the RF signal 58. In this regard, the time-variant target voltage envelope 104 is modified according to the RF signal 58 to create the ET modulated target voltage $V_{TARGET}$. The ET modulated voltage $V_{CC}$ is defined by a time-variant voltage envelope 106 that tracks the time-variant target voltage envelope 104.

The output node 98 is coupled to the amplifier circuit 56 to provide the ET modulated voltage $V_{CC}$ as a supply voltage to the amplifier circuit 56. The ET tracker circuitry 94 may also include switcher circuitry 108, which is configured to provide an alternate current (AC) current $I_{AC}$ to the output node 98.

The ET amplifier circuit 48 includes a voltage input path 110. The voltage input path 110 is coupled between a mixer 112 and the input node 96 of the ET tracker circuitry 94. The mixer 112 is coupled to an amplitude calculator 114 configured to calculate a time-variant amplitude of the digital baseband signal 54. The mixer 112 combines the time-variant amplitude(s) of the digital baseband signal 54 with a digital target voltage signal 116 such that the digital target voltage signal 116 would have the time-variant target voltage envelope 104 that tracks the time-variant input amplitude envelope 64. The voltage input path 110 may include fine delay circuitry 118 configured to add a delay to the digital target voltage signal 116. The voltage input path 110 includes a DAC 120 coupled to the input node 96 of the ET tracker circuitry 94. The DAC 120 is configured to convert the digital target voltage signal 116 into the ET modulated target voltage signal 102.

Figure 2B:
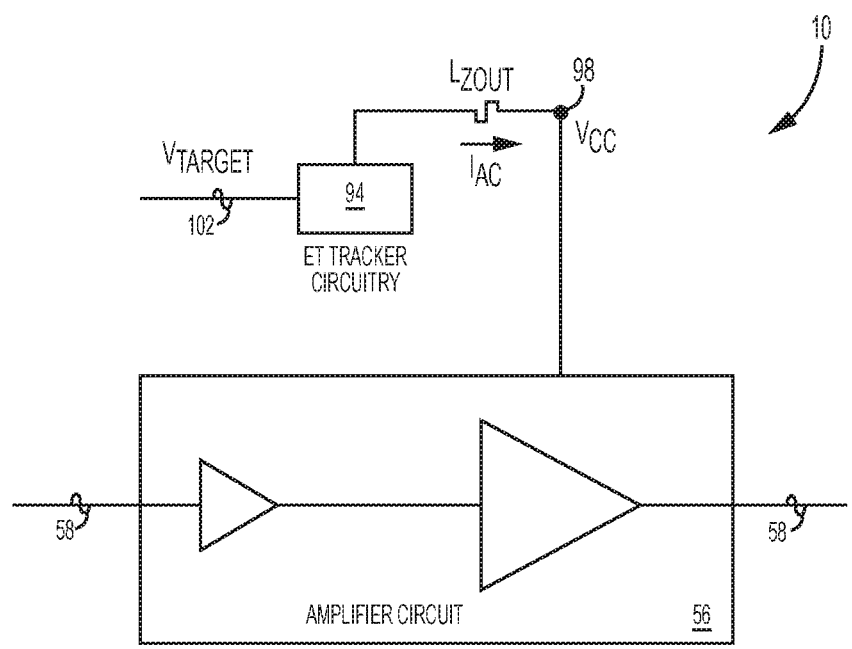
FIG. 2B is a schematic diagram showing that an output impedance of an ET tracker circuitry in the ET amplifier circuit of FIG. 2A can be modeled by an output inductance.

The ET tracker circuitry 94 includes inherently output impedance $Z_{OUT}$, which can be modeled as being primarily determined by an output inductance $L_{ZOUT}$, as shown in FIG. 2B. FIG. 2B is a schematic diagram showing that the output impedance $Z_{OUT}$ of the ET tracker circuitry 94 of FIG. 2A can be modeled by the output inductance $L_{ZOUT}$. Common elements between FIGS. 2A and 2B are shown therein with common element numbers and will not be re-described herein.

Impact of the output inductance $L_{ZOUT}$ on the ET modulated output voltage $V_{CC}$ can be expressed in the equation (Eq. 3) below.

$$V_{CC}=V_{TARGET}-L_{ZOUT}\cdot dI_{AC}/dt \quad \text{(Eq. 3)}$$

As shown in equation (Eq. 3) above, the output inductance $L_{ZOUT}$ can cause a voltage deviation between the ET modulated target voltage $V_{TARGET}$ and the ET modulated voltage $V_{CC}$. Notably, the voltage deviation can be worsened when the RF signal 58 is encoded with a higher number of RBs and transmitted at a higher RF frequency. As a result, the time-variant voltage envelope 106 may deviate from the time-variant target voltage envelope 104. Given that the ET tracker 100 in the ET tracker circuitry 94 is provided as an amplifier configured to operate in a compression region (e.g., the nonlinearity region 32 of FIG. 1C), each dB deviation in the ET modulated voltage $V_{CC}$ can cause a dB of power gain error in the time-variant output amplitude envelope 66 of the RF signal 58. As such, it may be desired to improve linearity of the ET tracker 100 to help minimize the voltage deviation in the ET modulated voltage $V_{CC}$.

Figure 3:
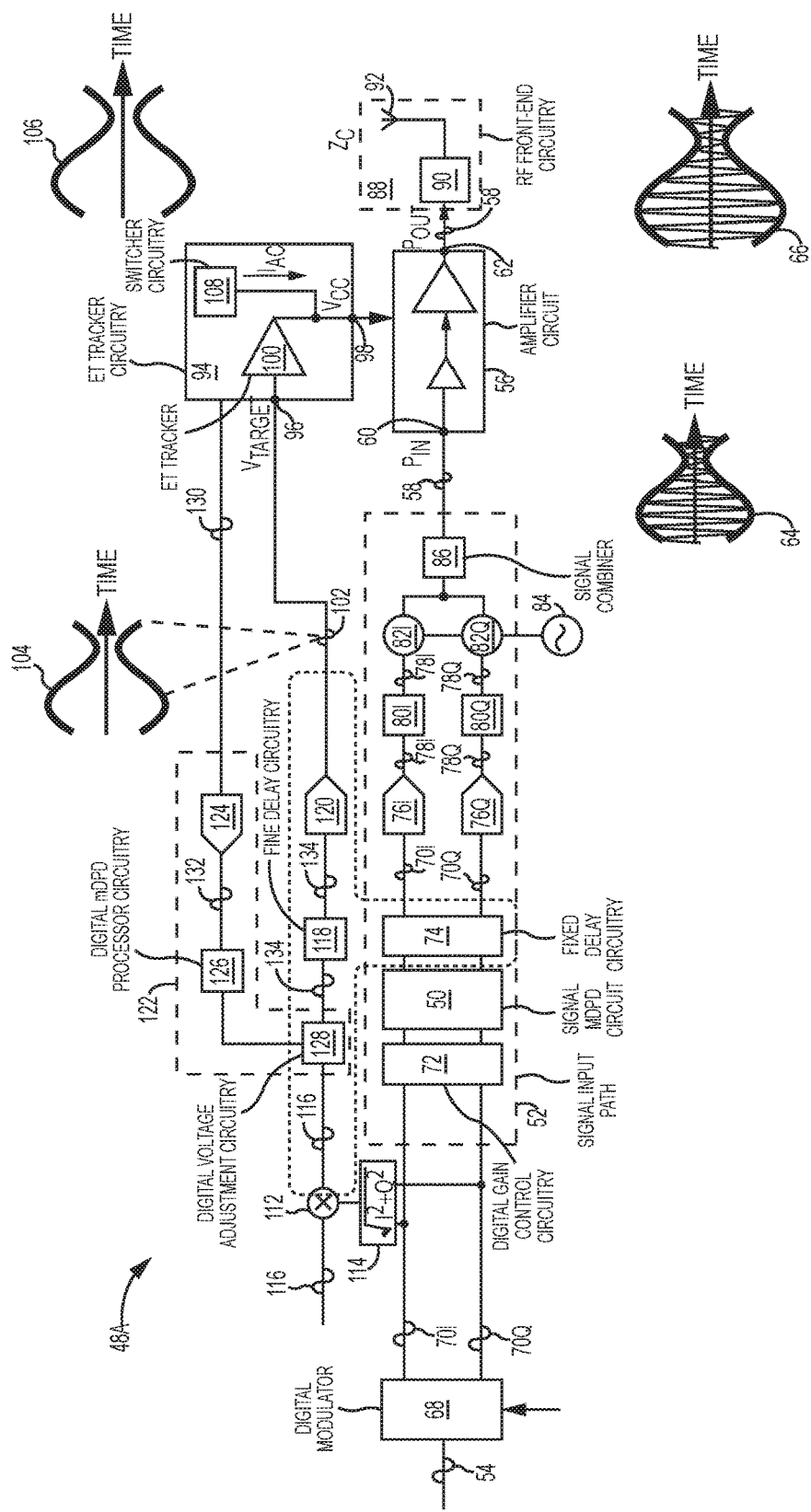
FIG. 3 is a schematic diagram of an exemplary ET amplifier circuit configured to support voltage mDPD according to one embodiment of the present disclosure.

In this regard, FIG. 3 is a schematic diagram of an exemplary ET amplifier circuit 48A including the ET amplifier circuit 48 of FIG. 2A and a voltage mDPD circuit 122 configured to minimize the voltage deviation in the ET modulated voltage $V_{CC}$. Notably, the voltage mDPD circuit 122 is added to the ET amplifier circuit 48 of FIG. 2A to maximize component reuse and minimize design changes. As a result, the ET amplifier circuit 48A includes many identical components and/or circuitries as provided in the ET amplifier circuit 48. As such, common elements between FIGS. 3 and 2A can be shown with common element numbers and thus will not be re-described herein.

As is described in detail below, the voltage mDPD circuit 122 is configured to determine a voltage deviation of the ET modulated voltage $V_{CC}$ relative to the ET modulated target voltage signal 102, which represents the ET modulated target voltage $V_{TARGET}$. The voltage mDPD circuit 122 executes an mDPD polynomial, such as the GMP as shown in equation (Eq. 2), in one or more iterations. Each of the iterations selectively extracts at least one mDPD coefficient. Accordingly, the voltage mDPD circuit 122 adjusts the time-variant target voltage envelope 104 based on the mDPD coefficient extracted in each of the iterations to reduce the voltage deviation to a predefined threshold. As will be further illustrated in FIGS. 5A-5C, the voltage mDPD circuit 122 can significantly reduce the voltage deviation between the ET modulated voltage $V_{CC}$ and the ET modulated target voltage $V_{TARGET}$. As a result, it is possible to ensure that the amplifier circuit 56 operates with desired linearity and efficiency in support of high ET bandwidth modulations (e.g., >250 MHz).

The voltage mDPD circuit 122 includes an analog-to-digital converter (ADC) 124 coupled to the ET tracker circuitry 94. The voltage mDPD circuit 122 includes digital mDPD processor circuitry 126 coupled to the ADC 124. The voltage mDPD circuit 122 also includes digital voltage adjustment circuitry 128 coupled to the digital mDPD processor circuitry 126.

The ADC 124 is configured to receive an analog voltage feedback signal 130 indicative of the ET modulated voltage $V_{CC}$ in a defined time interval. In a non-limiting example, the defined time interval can be a timeslot duration or a frame duration of the RF signal 58. The ADC 124 may receive the analog voltage feedback signal 130 from the output node 98 of the ET tracker circuitry 94 or via circuitry coupled to the output node 98 of the ET tracker circuitry 94. The analog voltage feedback signal 130 may be scaled up or down from the ET modulated voltage $V_{CC}$ based on a predetermined scale factor. The analog voltage feedback signal 130 may be provided to a high-pass filter, which is configured to retain only high-frequency content of the analog voltage feedback signal 130, prior to being received by the ADC 124. Alternatively, the analog feedback signal 130 may be provided to a low-pass filter, which is configured to retain only low-frequency content of the analog voltage feedback signal 130, prior to being received by the ADC 124. The ADC 124 is configured to convert the analog voltage feedback signal 130 to a digital voltage feedback signal 132 and provide the digital voltage feedback signal 132 to the digital mDPD processor circuitry 126.

The digital mDPD processor circuitry 126 may be provided as a microprocessor, a digital signal processor (DSP), or a field programmable gate array (FPGA). The digital mDPD processor circuitry 126 is configured to determine a voltage deviation between the ET modulated voltage in the defined time interval and the ET modulated target voltage signal 102. The digital mDPD processor circuitry 126 may determine the voltage deviation by comparing the digital voltage feedback signal 132 to the ET modulated target voltage signal 102 in the defined time interval. The digital mDPD processor circuitry 126 compares the determined voltage against the predefined threshold. If the determined voltage deviation is less than or equal to the predefined threshold, it is an indication that the mDPD polynomial has a convergence and, therefore, the digital mDPD processor circuitry 126 no longer needs to execute the mDPD polynomial. In contrast, if the determined voltage deviation is greater than the predefined threshold, the digital mDPD processor circuitry 126 executes the mDPD polynomial to extract an mDPD coefficient(s) and provides the mDPD coefficient(s) extracted from the mDPD polynomial to the digital voltage adjustment circuitry 128.

The digital voltage adjustment circuitry 128 generates a digital ET modulated target voltage signal 134 based on the mDPD coefficient(s) received from the digital mDPD processor circuitry 126. The digital ET modulated target voltage signal 134 includes the time-variant target voltage envelope 104 that is adjusted based on the mDPD coefficient(s). The digital voltage adjustment circuitry 128 provides the digital ET modulated target voltage signal 134 to the fine delay circuitry 118 and subsequently to the DAC 120. The DAC 120 is configured to convert the digital ET modulated target voltage signal 134 into the ET modulated target voltage signal 102 and provide the ET modulated target voltage signal 102 to the input node 96 of the ET tracker circuitry 94.

Figure 4:
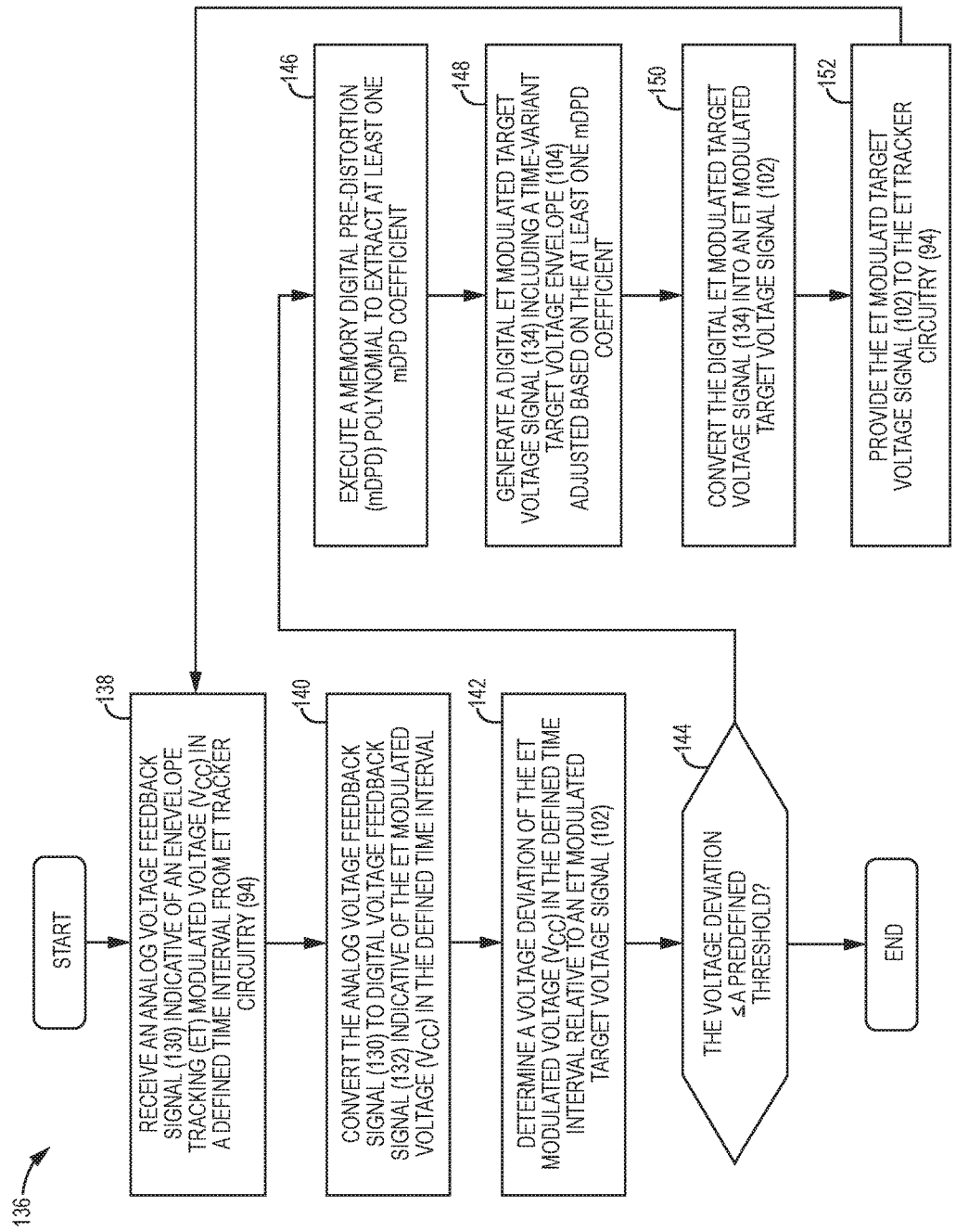
FIG. 4 is a flowchart of an exemplary process that can be employed by a voltage mDPD circuit in the ET amplifier circuit of FIG. 3 to minimize voltage deviation in an ET modulated voltage.

The voltage mDPD circuit 122 can be configured to minimize the voltage deviation based on a process. In this regard, FIG. 4 is a flowchart of an exemplary process 136 that can be employed by the voltage mDPD circuit 122 of FIG. 3 to minimize the voltage deviation in the ET modulated voltage $V_{CC}$.

In each of the iterations, the ADC 124 receives the analog voltage feedback signal 130 indicative of the ET modulated voltage $V_{CC}$ in the defined time interval from the ET tracker circuitry 94 (block 138). The ADC 124 then converts the analog voltage feedback signal 130 to the digital voltage feedback signal 132 indicative of the ET modulated voltage $V_{CC}$ in the defined time interval (block 140). In the same iteration, the digital mDPD processor circuitry 126 determines the voltage deviation of the ET modulated voltage $V_{CC}$ in the defined time interval relative to the ET modulated target voltage signal 102 (block 142). The digital mDPD processor circuitry 126 then determines whether the voltage deviation is less than or equal to the predefined threshold (block 144). If the voltage deviation is less than or equal to the predefined threshold, the digital mDPD processor circuitry 126 exits the iteration and the process 136 ends accordingly. Otherwise, the digital mDPD processor circuitry 126 executes the mDPD polynomial to extract the mDPD coefficient(s) (block 146). In the same iteration, the digital voltage adjustment circuitry 128 generates the digital ET modulated target voltage signal 134 including the time-variant target voltage envelope 104 that is adjusted based on the mDPD coefficient(s) (block 148). In the same iteration, the DAC 120 converts the digital ET modulated target voltage signal 134 into the ET modulated target voltage signal 102 (block 150). The DAC 120 subsequently provides the ET modulated target voltage signal 102 to the ET tracker circuitry 94 (block 152). At this point, the voltage mDPD circuit 122 has completed the iteration and returns to block 138 to start a new iteration.

Notably, the voltage mDPD circuit 122 is better suited for correcting the voltage deviation that causes a power gain error in the amplifier circuit 56. In contrast, the signal mDPD circuit 50 is better suited for correcting phase error in the RF signal 58. As such, the ET amplifier circuit 48A of FIG. 3 can be configured to include only the voltage mDPD circuit 122, or only the signal mDPD circuit 50, or a combination of the voltage mDPD circuit 122 and the signal mDPD circuit 50 based on intended functionalities and design capabilities of the ET amplifier circuit 48A. In one non-limiting example, it is possible to predetermine the functionalities and/or capabilities (e.g., during design phase) of the ET amplifier circuit 48A and configure the voltage mDPD circuit 122 and/or the signal mDPD circuit 50 according to a predefined static configuration. In another non-limiting example, it is also possible to determine the functionalities and/or capabilities of the ET amplifier circuit 48A dynamically. Accordingly, it is possible to enable the voltage mDPD circuit 122 and/or the signal mDPD circuit 50 dynamically. Table 1 below provides an exemplary summary of system parameter that can help determine how to configure the ET amplifier circuit 48A.

TABLE 1

| | Voltage mDPD Circuit (122) Not Included | Voltage mDPD Circuit (122) Included |
|---|---|---|
| Signal mDPD Circuit (50) Not Included | RF signal (58) includes less than 100 RBs | RF signal (58) includes more than 300 RBs Phase variation of the RF signal (58) less than 3° frequency-dependent impedance ($Z_C$) varies less than 20% relative to carrier frequency of the RF signal (58) RF signal (58) is a Wi-Fi signal transmitted in 80 GHz frequency spectrum |
| Signal mDPD Circuit (50) Included | RF signal (58) includes 200-300 RBs Phase variation of the RF signal (58) more than 3° frequency-dependent impedance ($Z_C$) varies more than 20% relative to carrier frequency of the RF signal (58) | RF signal (58) includes more than RBs Phase variation of the RF signal (58) more than 3° frequency-dependent impedance ($Z_C$) varies more than 20% relative to carrier frequency of the RF signal (58) |

Figure 5A:
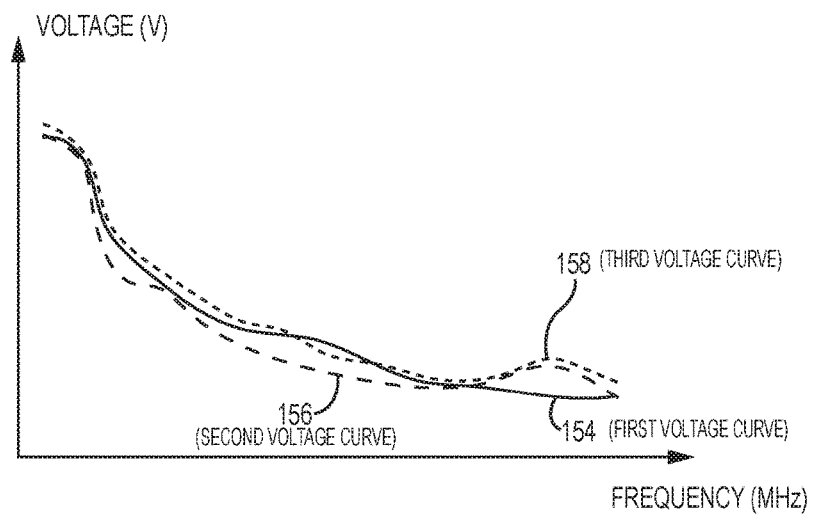
FIGS. 5A-5C are graphs providing exemplary illustrations of performance improvements of the ET amplifier circuit of FIG. 3.
Figure 5B:
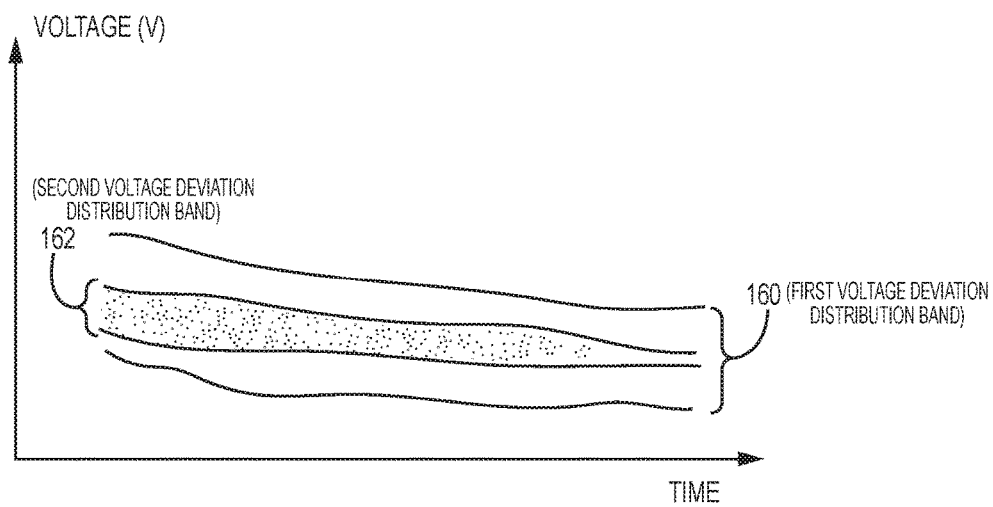
Figure 5C:
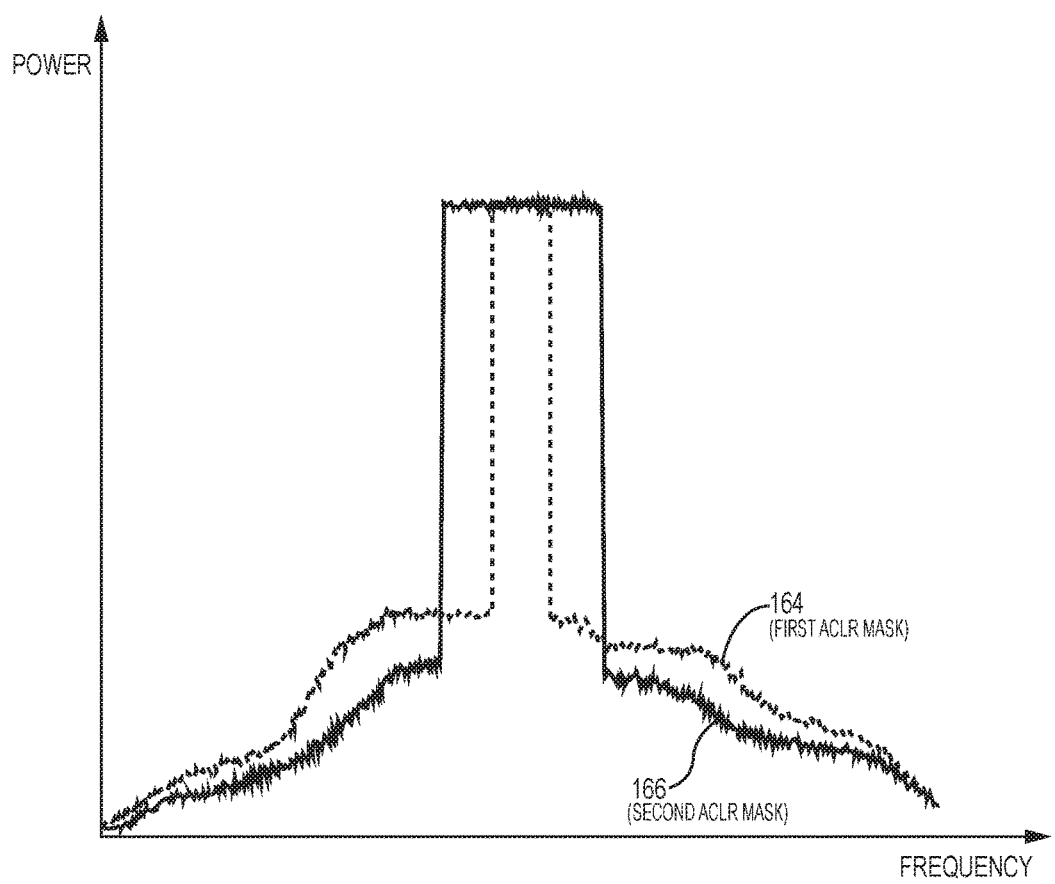

FIGS. 5A-5C are graphs providing exemplary illustrations of performance improvements of the ET amplifier circuit 48A of FIG. 3 as a result of reducing the voltage deviation in the ET modulated voltage $V_{CC}$.

FIG. 5A includes a first voltage curve 154, a second voltage curve 156, and a third voltage curve 158. The first voltage curve 154 represents the ET modulated target voltage $V_{TARGET}$, the second voltage curve 156 represents the ET modulated voltage $V_{CC}$ without the voltage mDPD circuit 122, and the third voltage curve 158 represents the ET modulated voltage $V_{CC}$ with the voltage mDPD circuit 122. As shown in FIG. 5A, when the voltage mDPD circuit 122 is provided in the ET amplifier circuit 48A, the ET modulated voltage $V_{CC}$ tracks more closely with the ET modulated target voltage $V_{TARGET}$, which is an indication of reduced voltage deviation.

FIG. 5B includes a first voltage deviation distribution band 160 and a second voltage deviation distribution band 162. The first voltage deviation distribution band 160 illustrates voltage deviation distribution over time without the voltage mDPD circuit 122, while the second voltage deviation distribution band 162 illustrates voltage deviation distribution over time with the voltage mDPD circuit 122. As shown in FIG. 5B, the second voltage deviation distribution band 162 is narrower and more flattened than the first voltage deviation distribution band 160. This is an indication that the voltage mDPD circuit 122 can reduce the voltage deviation of the ET modulated voltage $V_{CC}$.

FIG. 5C illustrates RF spectrum improvements as a result of employing the voltage mDPD circuit 122 in the ET amplifier circuit 48A. FIG. 5C includes a first adjacent channel leakage ratio (ACLR) mask 164 and a second ACLR mask 166. The first ACLR mask 164 indicates ACLR of the RF signal 58 without the voltage mDPD circuit 122 and the second ACLR mask 166 indicates ACLR of the RF signal 58 with the voltage mDPD circuit 122. As shown in FIG. 5C, the ACLR of the RF signal 58 with the voltage mDPD circuit 122 is significantly lower than the ACLR without the voltage mDPD circuit 122.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier circuit comprising:
at least one amplifier circuit configured to amplify a radio frequency (RF) signal based on an ET modulated voltage;
ET tracker circuitry configured to receive an ET modulated target voltage signal comprising a time-variant target voltage envelope and generate the ET modulated voltage comprising a time-variant voltage envelope tracking the time-variant target voltage envelope; and
a voltage input path configured to provide the ET modulated target voltage signal to the ET tracker circuitry, the voltage input path comprises a voltage memory digital pre-distortion (mDPD) circuit configured to:
determine a voltage deviation of the ET modulated voltage relative to the ET modulated target voltage signal;
execute an mDPD polynomial in one or more iterations, each selectively configured to extract at least one mDPD coefficient; and
adjust the time-variant target voltage envelope based on the at least one mDPD coefficient extracted in each of the one or more iterations to reduce the voltage deviation to a predefined threshold.

2. The ET amplifier circuit of claim 1 wherein the voltage mDPD circuit comprises:
an analog-to-digital converter (ADC) coupled to the ET tracker circuitry;
digital mDPD processor circuitry coupled to the ADC; and
digital voltage adjustment circuitry coupled to the digital mDPD processor circuitry.

3. The ET amplifier circuit of claim 2 wherein in each of the one or more iterations, the ADC is configured to:
receive an analog voltage feedback signal indicative of the ET modulated voltage in a defined time interval;
convert the analog voltage feedback signal to a digital voltage feedback signal indicative of the ET modulated voltage in the defined time interval; and
provide the digital voltage feedback signal to the digital mDPD processor circuitry.

4. The ET amplifier circuit of claim 3 wherein the ADC is further configured to receive the analog voltage feedback signal indicative of the ET modulated voltage in each timeslot duration of the RF signal.

5. The ET amplifier circuit of claim 3 wherein the ADC is further configured to receive the analog voltage feedback signal indicative of the ET modulated voltage in each frame duration of the RF signal.

6. The ET amplifier circuit of claim 3 wherein in each of the one or more iterations:
the digital mDPD processor circuitry is configured to:
determine the voltage deviation of the ET modulated voltage in the defined time interval relative to the ET modulated target voltage signal;
execute the mDPD polynomial to extract the at least one mDPD coefficient; and
provide the at least one mDPD coefficient to the digital voltage adjustment circuitry; and
the digital voltage adjustment circuitry is configured to generate a digital ET modulated target voltage signal comprising the time-variant target voltage envelope adjusted based on the at least one mDPD coefficient.

7. The ET amplifier circuit of claim 6 wherein in each of the one or more iterations, the digital mDPD processor circuitry is further configured to compare the voltage deviation to the predefined threshold and terminate the one or more iterations in response to the voltage deviation being equal to or less than the predefined threshold.

8. The ET amplifier circuit of claim 6 wherein the voltage input path further comprises a digital-to-analog converter (DAC) coupled to the digital voltage adjustment circuitry and configured to convert the digital ET modulated target voltage signal to the ET modulated target voltage signal and provide the ET modulated target voltage signal to the ET tracker circuitry.

9. The ET amplifier circuit of claim 1 wherein the voltage mDPD circuit is provided in the voltage input path when the RF signal is determined to comprise more than three hundred resource blocks (RBs).

10. The ET amplifier circuit of claim 1 wherein the voltage mDPD circuit is provided in the voltage input path when the RF signal is determined to have less than three degrees phase variation.

11. The ET amplifier circuit of claim 1 wherein the voltage mDPD circuit is provided in the voltage input path when the RF signal is determined to comprise more than three hundred resource blocks (RBs) and the RF signal is determined to have less than three degrees phase variation.

12. The ET amplifier circuit of claim 1 wherein:
the at least one amplifier circuit is further configured to receive the RF signal in a carrier frequency at a signal input and output the RF signal in the carrier frequency at a signal output;
the signal output is coupled to frequency-dependent impedance varying in proportion to the carrier frequency of the RF signal; and
the voltage mDPD circuit is provided in the voltage input path when the frequency-dependent impedance coupled to the signal output varies less than twenty percent relative to the carrier frequency.

13. The ET amplifier circuit of claim 1 wherein the voltage mDPD circuit is provided in the voltage input path when the RF signal is determined to be a Wi-Fi signal transmitted in 80 GHz frequency spectrum.

14. The ET amplifier circuit of claim 1 further comprising a signal input path coupled to the at least one amplifier circuit and configured to:
receive a digital in-phase (I) signal and a digital quadrature (Q) signal;
convert the digital I signal and the digital Q signal to the RF signal; and
provide the RF signal to the at least one amplifier circuit.

15. The ET amplifier circuit of claim 14 wherein the signal input path comprises:
a signal mDPD circuit configured to process the digital I signal and the digital Q signal to suppress non-linear behavior of the at least one amplifier circuit;
an I signal digital-to-analog converter (DAC) configured to convert the digital I signal into an analog I signal;
a Q signal DAC configured to convert the digital Q signal into an analog Q signal; and
a signal combiner configured to:
combine the analog I signal and the analog Q signal to generate the RF signal; and
provide the RF signal to the at least one amplifier circuit.

16. The ET amplifier circuit of claim 15 wherein the signal mDPD circuit is provided in the signal input path when the RF signal is determined to comprise more than three hundred resource blocks (RBs).

17. The ET amplifier circuit of claim 15 wherein the signal mDPD circuit is provided in the signal input path when the RF signal is determined to have more than three degrees phase variation.

18. The ET amplifier circuit of claim 15 wherein the signal mDPD circuit is provided in the signal input path when the RF signal comprises more than three hundred resource blocks (RBs) and the RF signal has more than three degrees phase variation.

19. A method for performing voltage memory digital pre-distortion (mDPD) in an envelope tracking (ET) amplifier circuit comprising:
determining a voltage deviation of an ET modulated voltage relative to an ET modulated target voltage signal, wherein the ET modulated target voltage signal comprises a time-variant target voltage envelope and the ET modulated voltage comprises a time-variant voltage envelope tracking the time-variant target voltage envelope;
executing an mDPD polynomial in one or more iterations, each selectively configured to extract at least one mDPD coefficient; and
adjusting the time-variant target voltage envelope based on the at least one mDPD coefficient extracted in each of the one or more iterations to reduce the voltage deviation to a predefined threshold.

20. The method of claim 19 further comprising in each of the one or more iterations:
receiving an analog voltage feedback signal indicative of the ET modulated voltage in a defined time interval;
converting the analog voltage feedback signal to a digital voltage feedback signal indicative of the ET modulated voltage in the defined time interval;

determining the voltage deviation of the ET modulated voltage in the defined time interval relative to the ET modulated target voltage signal;

executing the mDPD polynomial to extract the at least one mDPD coefficient;

generating a digital ET modulated target voltage signal having the time-variant target voltage envelope adjusted based on the at least one mDPD coefficient; and converting the digital ET modulated target voltage signal to the ET modulated target voltage signal.

21. The method of claim 20 further comprising:

comparing the voltage deviation to the predefined threshold in each of the one or more iterations; and terminating the one or more iterations in response to the voltage deviation being equal to or less than the predefined threshold.

* * * * *

UNITED STATES PATENT AND TRADEMARK OFFICE
CERTIFICATE OF CORRECTION

PATENT NO. : 10,284,412 B2
APPLICATION NO. : 15/792909
DATED : May 7, 2019
INVENTOR(S) : Nadim Khlat et al.

It is certified that error appears in the above-identified patent and that said Letters Patent is hereby corrected as shown below:

In the Specification

In Column 6:
For Eq. 1, replace "$y_k = h_0 + \Sigma_{n=1}^{N} \Sigma_{d=0}^{D} h_{n,d} \cdot |x_{k-d}|^{n-1} \cdot x_{k-d}$" with $$y_k = h_0 + \sum_{n=1}^{N} \sum_{d=0}^{D} h_{n,d} \cdot |x_{k-d}|^{n-1} \cdot x_{k-d}$$ --;

For Eq. 2, replace "$y_k = h_0 + \Sigma_{n=1}^{Na}\Sigma_{d=0}^{Da1} a_{n,d1} \cdot |x_{k-d1}|^{n-1} \cdot x_{k-d1} + \Sigma_{n=1}^{Nb}\Sigma_{d1=0}^{Db1}\Sigma_{d2=0}^{Db2} b_{n,d1,d2} \cdot |x_{k-d1-d2}|^{n-1} \cdot x_{k-d1} + \Sigma_{n=1}^{Nc}\Sigma_{d1=0}^{Dc1}\Sigma_{d2=0}^{Dc2} c_{n,d1,d2} \cdot |x_{k-d1+d2}|^{n-1} \cdot x_{k-d1}$" with $$y_k = h_0 + \sum_{n=1}^{Na} \sum_{d=0}^{Da1} a_{n,d1} \cdot |x_{k-d1}|^{n-1} \cdot x_{k-d1} +$$

$$\sum_{n=1}^{Nb} \sum_{d1=0}^{Db1} \sum_{d2=0}^{Db2} b_{n,d1,d2} \cdot |x_{k-d1-d2}|^{n-1} \cdot x_{k-d1} +$$

$$\sum_{n=1}^{Nc} \sum_{d1=0}^{Dc1} \sum_{d2=0}^{Dc2} c_{n,d1,d2} \cdot |x_{k-d1+d2}|^{n-1} \cdot x_{k-d1}$$ --.

In Column 7:
Lines 1-3, replace "The term $\Sigma_{n=1}^{Nb}\Sigma_{d1=0}^{Db1}\Sigma_{d2=0}^{Db2} b_{n,d1,d2} * j|x_{k-d1-d2}|^{n-1} * x_{k-d1}$ and the term $\Sigma_{n=1}^{Nc}\Sigma_{d1=0}^{Dc1}\Sigma_{d2=0}^{Db2} c_{n,d1,d2} * |x_{k-d1+d2}|^{n-1} * x_{k-d1}$" with --The term $\sum_{n=1}^{Nb} \sum_{d1=0}^{Db1} \sum_{d2=0}^{Db2} b_{n,d1,d2} * |x_{k-d1-d2}|^{n-1} * x_{k-d1}$ and the term $\sum_{n=1}^{Nc} \sum_{d1=0}^{Dc1} \sum_{d2=0}^{Db2} c_{n,d1,d2} * |x_{k-d1+d2}|^{n-1} * x_{k-d1}$ --;

Line 52, replace "761" with --76I--;
Lines 53, 58, 63, and 67, replace "781" with --78I--;

Signed and Sealed this
Ninth Day of July, 2019

Andrei Iancu
*Director of the United States Patent and Trademark Office*

CERTIFICATE OF CORRECTION (continued)
U.S. Pat. No. 10,284,412 B2

Line 57, replace "801" with --80I--;
Lines 60 and 62, replace "821" with --82I--.